United States Patent
Noro et al.

(10) Patent No.: US 10,658,063 B2
(45) Date of Patent: May 19, 2020

(54) SEMICONDUCTOR MEMORY DEVICE INCLUDING A CORRECTING CIRCUIT

(71) Applicant: TOSHIBA MEMORY CORPORATION, Minato-ku, Tokyo (JP)

(72) Inventors: Hiromi Noro, Kawasaki Kanagawa (JP); Kenji Tsuchida, Kawasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/123,558

(22) Filed: Sep. 6, 2018

(65) Prior Publication Data

US 2019/0130986 A1    May 2, 2019

(30) Foreign Application Priority Data

Oct. 26, 2017 (JP) ................. 2017-207129

(51) Int. Cl.
| | |
|---|---|
| *G11C 16/04* | (2006.01) |
| *G11C 29/04* | (2006.01) |
| *G11C 11/16* | (2006.01) |
| *G11C 29/52* | (2006.01) |

(52) U.S. Cl.
CPC ............ *G11C 29/04* (2013.01); *G11C 11/161* (2013.01); *G11C 11/1655* (2013.01); *G11C 11/1657* (2013.01); *G11C 29/52* (2013.01); *G11C 2029/0411* (2013.01)

(58) Field of Classification Search
CPC .................................... G06F 11/1048
USPC ....................................... 365/185.09
See application file for complete search history.

(56) References Cited

U.S. PATENT DOCUMENTS

| | | |
|---|---|---|
| 6,304,482 B1 | 10/2001 | Lin et al. |
| 6,400,633 B1 | 6/2002 | Al-Shamma et al. |
| 6,829,682 B2 | 12/2004 | Kirihata et al. |
| 7,149,949 B2 | 12/2006 | Jedwab et al. |
| 7,203,794 B2 | 4/2007 | Ji et al. |
| 7,203,886 B2 | 4/2007 | Brown et al. |
| 7,843,719 B2 | 11/2010 | Hung et al. |
| 7,936,591 B2 | 5/2011 | Itagaki et al. |
| 8,159,864 B2 | 4/2012 | Yoon et al. |
| 8,228,715 B2 | 7/2012 | Andre et al. |
| 8,514,615 B2 | 8/2013 | Slaughter |
| 8,683,185 B2 | 3/2014 | Flachs et al. |
| 8,811,071 B2 | 8/2014 | Alam et al. |
| 9,112,536 B2 | 8/2015 | Alam et al. |
| 9,170,879 B2 | 10/2015 | Yang |

(Continued)

FOREIGN PATENT DOCUMENTS

| | | |
|---|---|---|
| TW | 201521027 A | 6/2015 |
| TW | I579693 B | 4/2017 |
| TW | 201719673 A | 6/2017 |

*Primary Examiner* — Hoai V Ho
(74) *Attorney, Agent, or Firm* — Holtz, Holtz & Volek PC

(57) ABSTRACT

According to one embodiment, a semiconductor memory device includes a memory cell, a read circuit, a correcting circuit and a write circuit. The read circuit is configured to read first data from the memory cell by receiving a first command. The correcting circuit is configured to generate second data by correcting an error included in the first data. The write circuit is configured to write the second data to the memory cell in response to receiving a second command.

8 Claims, 7 Drawing Sheets

(56) References Cited

U.S. PATENT DOCUMENTS

| | | |
|---|---|---|
| 9,245,611 B2 | 1/2016 | Alam et al. |
| 9,348,697 B2 | 5/2016 | Hoya |
| 2003/0093744 A1* | 5/2003 | Leung ................. G06F 11/1048 714/763 |
| 2005/0204091 A1 | 9/2005 | Kilbuck et al. |
| 2006/0062048 A1* | 3/2006 | Gonzalez .............. G06F 11/106 365/185.11 |
| 2015/0074489 A1 | 3/2015 | Kashiwagi et al. |
| 2015/0149702 A1 | 5/2015 | Yeh |
| 2017/0315925 A1 | 11/2017 | Yeh |
| 2018/0074737 A1* | 3/2018 | Osada ................... G06F 3/0625 |
| 2018/0277204 A1* | 9/2018 | Takada ................. G11C 13/004 |

\* cited by examiner

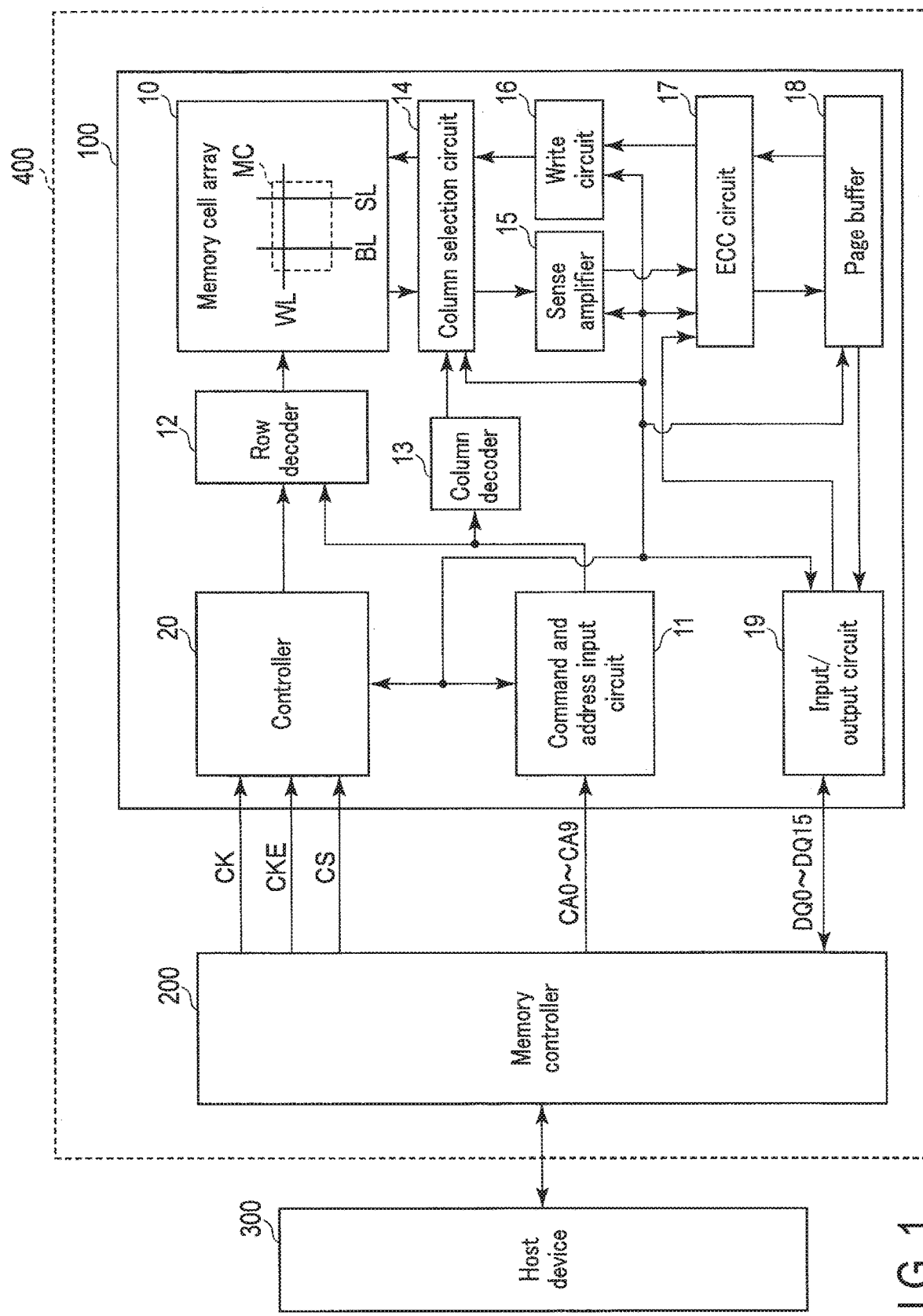
F I G. 1

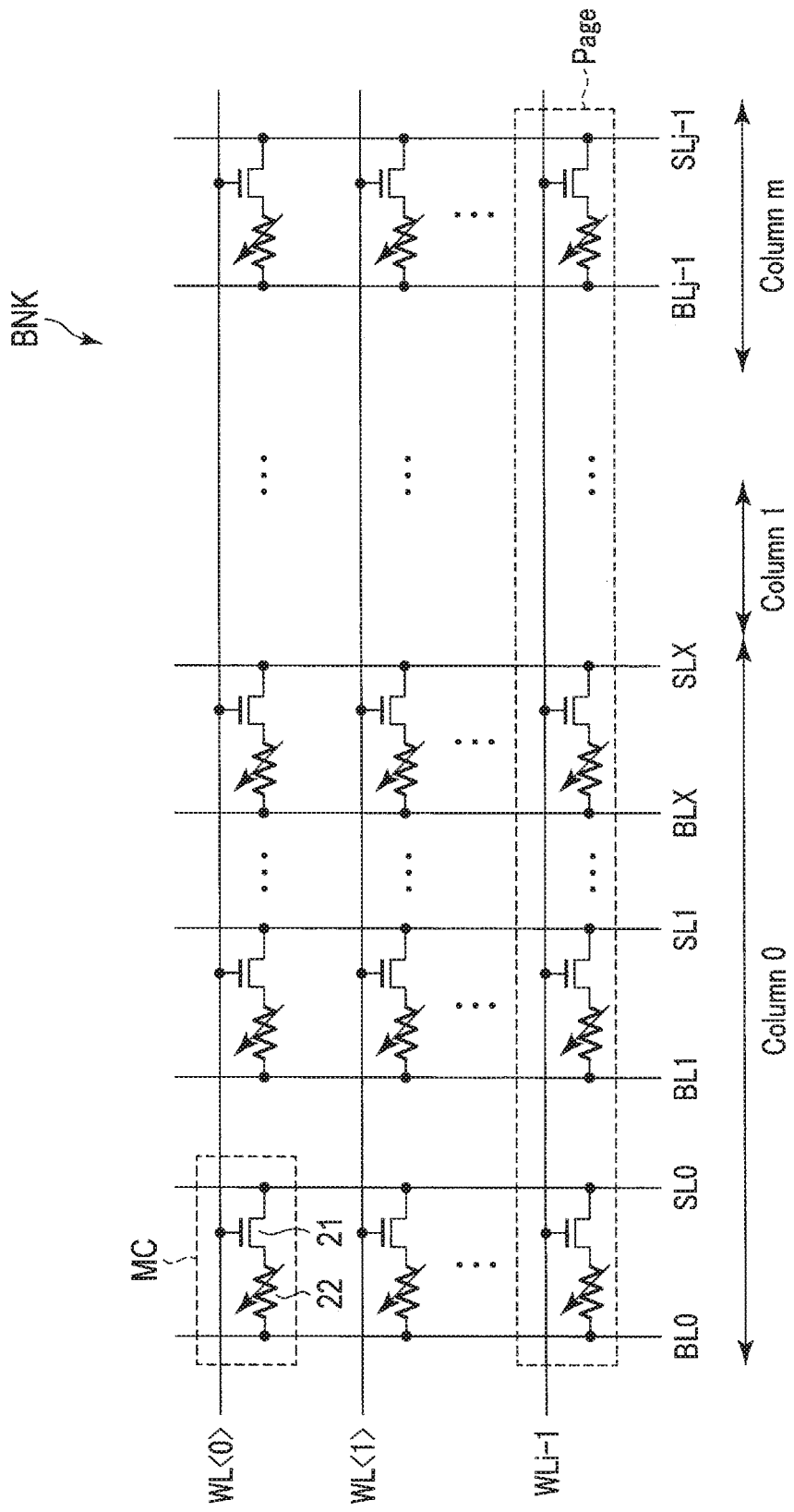
F I G. 2

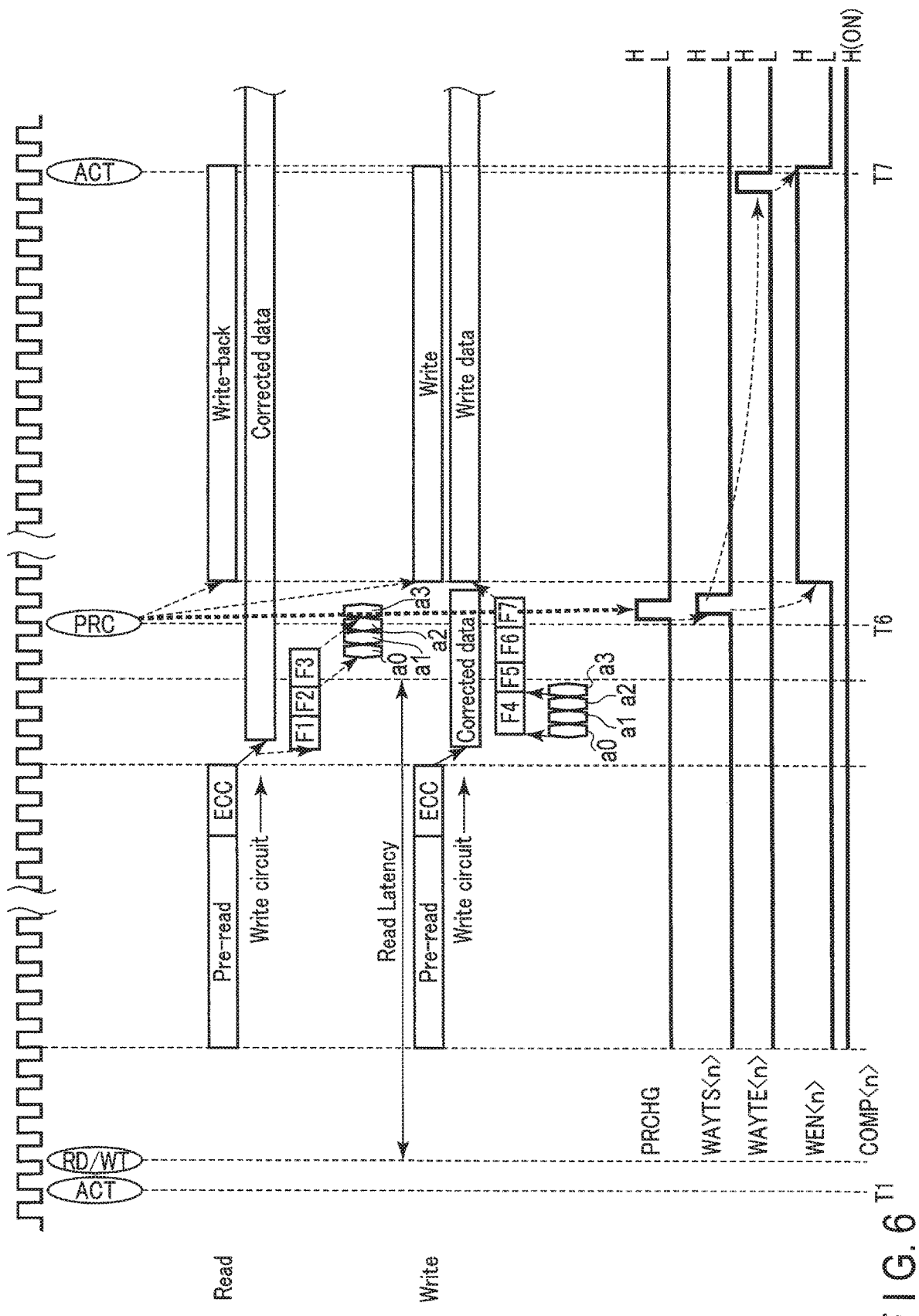
F I G. 6

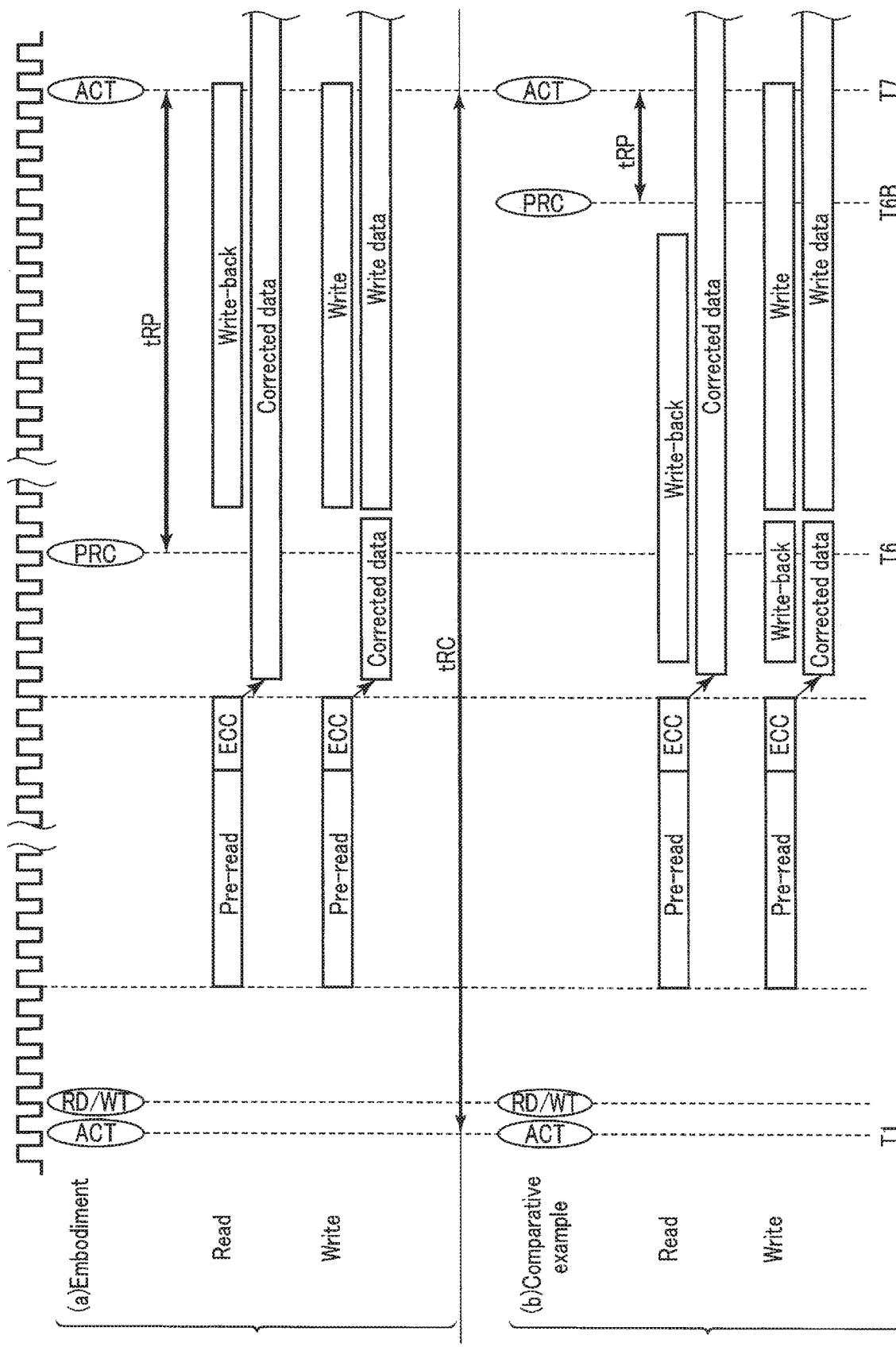
F I G. 7

SEMICONDUCTOR MEMORY DEVICE INCLUDING A CORRECTING CIRCUIT

CROSS-REFERENCE TO RELATED APPLICATIONS

This application is based upon and claims the benefit of priority from the Japanese Patent Application No. 2017-207129, filed Oct. 26, 2017, the entire contents of which are incorporated herein by reference.

FIELD

Embodiments described herein relate generally to a semiconductor memory device.

BACKGROUND

As a semiconductor memory device, for example, a magnetoresistive random access memory (MRAM) using a magnetoresistive effect in a memory cell is known. An MRAM is receiving attention as a memory device characterized by its high-speed operation, large storage capacity, and non-volatility.

BRIEF DESCRIPTION OF THE DRAWINGS

FIG. 1 is a block diagram showing a configuration of a semiconductor memory device of an embodiment.

FIG. 2 is a circuit diagram of a bank in a memory cell array in the semiconductor memory device of the embodiment.

FIG. 6 is a timing chart of a signal in the operational flow of the semiconductor memory device of the embodiment.

FIG. 7 is a diagram showing times tRP and tRC in the operational flow of the semiconductor memory device of the embodiment.

DETAILED DESCRIPTION

Figure 3:
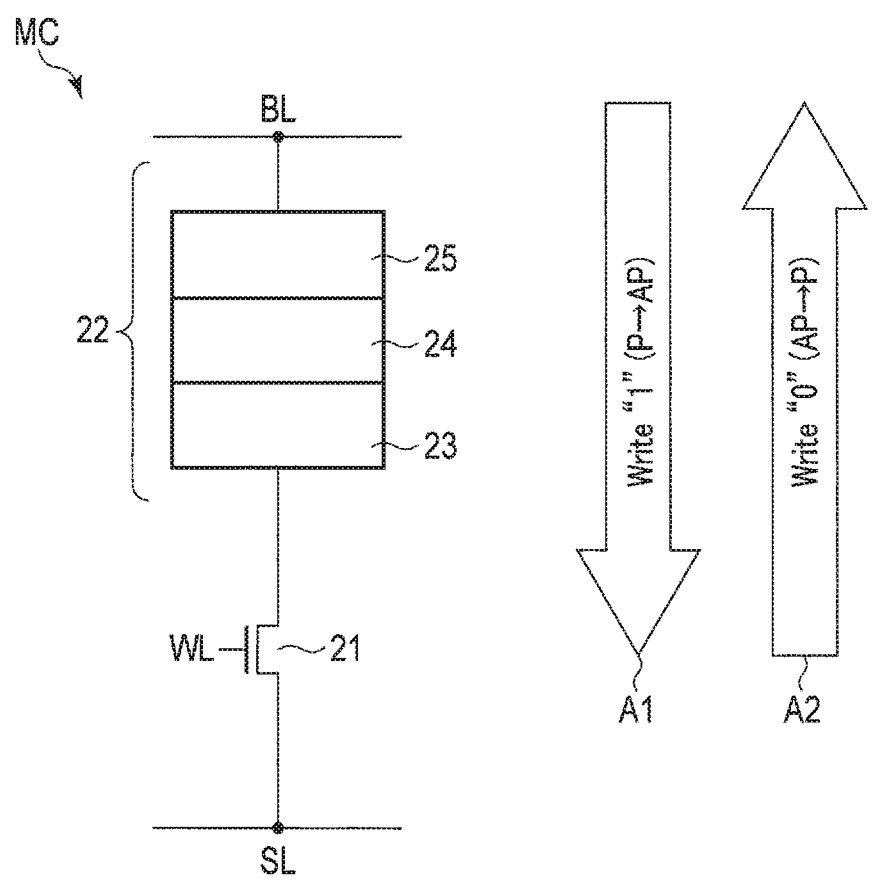
FIG. 3 is a schematic diagram of a memory cell in the memory cell array in the semiconductor memory device of the embodiment.

In general, according to one embodiment, a semiconductor memory device includes a memory cell, a read circuit, a correcting circuit and a write circuit. The read circuit is configured to read first data from the memory cell by receiving a first command. The correcting circuit is configured to generate second data by correcting an error included in the first data. The write circuit is configured to write the second data to the memory cell in response to receiving a second command.

Embodiments will be explained with reference to the accompanying drawings. In the explanation below, constituent elements having the same functions and configurations will be denoted by the same reference symbols. Each of the embodiments described below merely indicates an exemplary apparatus or method for implementing the technical idea of the embodiment; however, does not limit the element materials, shapes, structures, arrangements, etc. to the ones described below.

Each of the function blocks can be implemented in the form of hardware, computer software, or a combination thereof. The function blocks do not have to be categorized as in the example described below. For example, part of the functions may be implemented by a function block other than the exemplary function blocks. In addition, the exemplary function blocks may be further divided into function sub-blocks. Here, a magnetoresistive random access memory (MRAM) will be given as an example of the semiconductor memory device.

[1] Embodiment

A semiconductor memory device according to the present embodiment will be explained.

[1-1] Configuration of Memory System

First, a configuration of a memory system including the semiconductor memory device of the present embodiment will be explained. FIG. is a block diagram showing the semiconductor memory device of the embodiment, and the configuration of the memory system including the semiconductor memory device. A memory system 400 includes a semiconductor memory device 100 and a memory controller 200.

The semiconductor memory device 100 is configured by, for example, a semiconductor chip including an MRAM. Details of the semiconductor memory device 100 will be described later on.

The memory controller 200 is connected to the semiconductor memory device 100 by a bus interface. The memory controller 200 is also connected to an external host device 300 by a host bus interface. The memory controller 200 controls the semiconductor memory device 100, and, in accordance with an instruction received from the host device 300, controls reading and writing, etc. with respect to the semiconductor memory device 100.

[1-2] Configuration of Semiconductor Memory Device

A configuration of the semiconductor memory device 100 of the present embodiment will be explained with reference to FIG. 1. The semiconductor memory device 100 includes a memory cell array 10, a command and address input circuit 11, a row decoder 12, a column decoder 13, a column selection circuit 14, a sense amplifier 15, a write circuit 16, an error checking and correcting (ECC) circuit 17, a page buffer 18, an input/output circuit 19, and a controller 20.

The memory cell array 10 includes a plurality of memory cells MC arranged in rows and columns. Memory cells MC arranged in the same row are coupled to the same word line WL, and both ends of each of the memory cells MC arranged in the same column are coupled to the same bit line BL and the same source line SL. The memory cell array 10 will be described in detail later on.

The command and address input circuit 11 is, for example, connected to the memory controller 200 via command/address lines CA0 to CA9. The command and address input circuit 11 receives command and address signals from the memory controller 200 via the command/address lines CA0 to CA9. The command and address input circuit 11 outputs the command and address signals to the row decoder 12, the column decoder 13, and the controller 20.

The commands received by the command and address input circuit 11 are instructions for controlling the operation of the semiconductor memory device 100, and includes, for example, active commands, read commands, write commands, pre-charge commands, and reset commands. The active commands are commands for (selecting) activating one bank, and activating (selecting) one line among a plurality of word lines in the selected bank. The pre-charge commands are commands for bringing the selected bank to an initial state (pre-charge state) for a read operation or a write operation. Specifically, upon a pre-charge operation, all of the word lines, bit lines, and source lines in the selected bank are inactivated (brought to a non-selected state).

The row decoder 12 decodes an address signal of the command and address signals. In accordance with the decoding result, the row decoder 12 selects a word line in the determined bank.

The column decoder 13 decodes an address signal of the command and address signals. The column decoder 13 transmits the decoding result to the column selection circuit 14.

The column selection circuit 14 is connected to a plurality of bit lines, a plurality of source lines, the sense amplifier 15, and the write circuit 16. The column selection circuit 14 selects a column based on the decoding result of the column decoder 13. In other words, the column decoder 13 selects a plurality of bit lines and a plurality of source lines designated by a column address, and connects these lines to the sense amplifier 15 or the write circuit 16.

The sense amplifier 15 is coupled to the plurality of bit lines and the plurality of source lines selected by the column selection circuit 14. By sensing each of the currents flowing in the plurality of read-target memory cells, the sense amplifier 15 collectively reads data stored in the plurality of memory cells. Hereinafter, a unit of a plurality of memory cells collectively read by the sense amplifier 15 will be called a "page".

The write circuit 16 is coupled to the plurality of bit lines and the plurality of source lines selected by the column selection circuit 14. The write circuit 16 applies a write voltage (write pulse) to the plurality of write-target memory cells. The write circuit 16 writes data to the memory cell by applying a write current to the plurality of memory cells. Data writing is performed collectively on the plurality of memory cells.

The error checking and correcting (ECC) circuit 17 performs error correction processing on the data. More specifically, upon a write operation, the ECC circuit 17 generates an error correcting code (hereinafter described as a parity bit) by using, for example, data (hereinafter described as write data) supplied from the memory controller 200. Upon a read operation, the ECC circuit 17 detects whether or not there is an error in data (hereinafter described as read data) that is read from the memory cell and includes the parity bit. In the case where an error is detected in the data, the ECC circuit 17 corrects the detected error. Hereinafter, the read data in which the error is corrected will be described as corrected data.

The page buffer 18 temporarily stores the write data and the read data (including the parity bit). Specifically, upon the write operation, the page buffer 18 temporarily stores the write data supplied from the input/output circuit 19. Upon the read operation, the page buffer 18 temporarily stores the corrected data (or the read data).

The input/output circuit 19 is, for example, connected to the memory controller 200 via sixteen data lines DQ0 to DQ15. The data lines DQ0 to DQ15 are bidirectional data paths. The input/output circuit 19 is also connected to the page buffer 18. The input/output circuit 19 receives data (write data) from the memory controller 200 via the data lines DQ0 to DQ15, and transmits the received write data to the page buffer 18. The input/output circuit 19 also outputs data (read data) that is stored in the page buffer 18 to the memory controller 200 via the data lines DQ0 to DQ15.

The controller 20 controls the semiconductor memory device 100. The controller 20 receives various control signals, such as a clock signal CK, a clock enable signal CKE, and a chip select signal CS, from the memory controller 200. The controller 20 controls, for example, the write operation and the read operation in accordance with a command signal including command and address signals transmitted from the command and address input circuit 11.

[1-2-1] Memory Cell Array

The memory cell array 10 in the semiconductor memory device 100 will be explained with reference to FIG. 2. The memory cell array 10 includes a plurality of banks including a plurality of memory cells that store data. Each of the banks is capable of performing a write or a read operation of data independently. FIG. 2 is a circuit diagram showing a configuration of a bank BNK in the memory cell array 10.

The memory cell MC is, for example, arranged in a matrix. In the memory cell array 10, i word lines WL (WL0 to WLi-1), j bit lines BL (BL0 to BLj-1), and j source lines SL (SL0 to SLj-1) are arranged. Symbols i and j are integers not less than 0. Memory cells MC of one row are coupled to one word line WL, and memory cells MC of one column are coupled to a pair of one bit line BL and one source line SL.

The memory cell MC includes a selection transistor 21 and a magnetoresistive element 22. Details of the magnetoresistive element 22 will be explained later on.

The selection transistor 21 is, for example, an n-type metal oxide semiconductor field effect transistor (MOSFET).

One end of the magnetoresistive element 22 is connected to one bit line BL, and the other end thereof is connected to a drain (or a source) of the selection transistor 21. The selection transistor 21 is connected to one word line WL at its gate, and to one source line SL at its source (or the drain).

When one word line WL is activated by the row decoder 12, the selection transistor 21 that is connected to this word line WL is turned on. When the selection transistor 21 is turned on, the magnetoresistive element 22 that is connected to the selection transistor 21 in the ON state is electrically connected to the pair of bit line BL and source line SL. A group of memory cells MC coupled to one word line WL corresponds to the "page" mentioned above.

A plurality of pairs of bit lines BL and source lines SL belong to one column. The bank BNK includes m+1 columns 0 to m. A target of reading and writing is selected by designating a row address (designating a word line WL) and a column.

In the case of a read operation, for example, data of all of the memory cells MC coupled to a word line WL selected by the read operation is temporarily stored in the page buffer 18. Furthermore, a part (column part) of data for one page is designated by a column address. The data of the column part that is designated by the column address is transmitted from the page buffer 18 to the input/output circuit 19. Also, in the case of a write operation, a page (word line) and a column of the write target are designated. The column address is supplied together with, for example, a read command or a write command.

[1-2-2] Memory Cell

The memory cells MC included in the memory cell array 10 will be explained with reference to FIG. 3. FIG. 3 is a schematic diagram showing a configuration of a memory cell MC in the memory cell array.

As shown in FIG. 3, for example, the memory cell MC includes a selection transistor 21 and a magnetoresistive element 22. The selection transistor 21 is provided as a switch for controlling supplying and stopping a current at the time of writing data to and reading data from the magnetoresistive element 22. The magnetoresistive element 22 includes a plurality of films that are laminated. By applying a current to the planes of the plurality of films in a perpendicular direction, a resistance value of the magnetoresistive element 22 is switched between a low resistance state and a high resistance state. The magnetoresistive element 22 allows data to be written by being in the low resistance state or in the high resistance state. The magnetoresistive element 22 stores written data in a non-volatile manner to function as a readable resistive memory element (or a variable resistance element and a resistance change element).

The gate of the selection transistor 21 is coupled to a word line WL, and one of the source or drain of the selection transistor 21 is coupled to a source line SL, and the other is coupled to one end of the magnetoresistive element 22. The other end of the magnetoresistive element 22 is coupled to the bit line BL.

[1-2-3] Magnetoresistive Element

An example of a configuration of the magnetoresistive element 22 in the memory cell MC will be explained. The magnetoresistive element. 22 of the present configuration example includes a storage layer 23, an intermediate layer 24, and a reference layer 25. The magnetoresistive element 22 may include more layers. The intermediate layer 24 is arranged between the storage layer 23 and the reference layer 25. The storage layer 23, the intermediate layer 24, and the reference layer 25 are laminated from the bottom in this order on their planes. The magnetoresistive element 22 is, for example, a perpendicular magnetization type magnetic tunnel junction (MTJ) element in which the magnetization direction of each of the storage layer 23 and the reference layer 25 is perpendicular to the plane.

The storage layer 23 includes one or more electrically-conductive magnetic materials, or consists of electrically-conductive magnetic materials. Specifically, the storage layer 23 includes one or more elements, such as iron (Fe), boron (B), and cobalt (Co), and includes, for example, cobalt iron boron (CoFeB) or iron boride (FeB). The storage layer 23 may include an artificial lattice. Alternatively, the storage layer 23 includes or consists of an alloy of Co, Fe, and B.

The storage layer 23 is magnetized in a direction along an axis, and the magnetization of the storage layer 23 is, for example, stable along an axis penetrating the layers 23, 24, and 25, for example, in a direction perpendicular to the interface surfaces between the layers 23, 24, and 25. In other words, the storage layer 23 has magnetic anisotropy along an axis penetrating the layers 23, 24, and 25, for example, a direction perpendicular to the interface surfaces of the layers 23, 24, and 25, and has so-called perpendicular magnetization anisotropy. The magnetization of the storage layer 23 can be stabilized in either one of the two directions along the axis of easy magnetization. The magnetization direction of the storage layer 23 can be reversed by a current (write current) flowing through the layers 23, 24, and 25.

The intermediate layer 24 includes or consists of a non-magnetic insulating material, and functions as a tunnel barrier. The intermediate layer 24 includes or consists of, for example, magnesium oxide (MgO).

The reference layer 25 includes or consists of an electrically-conductive magnetic material. The reference layer 25 includes at least one of Co, Pt, Pd, and Ni. The reference layer 25 includes or consists of, for example, cobalt platinum (CoPt), cobalt nickel (CoNi) or cobalt palladium (CoPd). The reference layer 25 may be made of the same material as the storage layer 23.

The reference layer 25 has perpendicular magnetization anisotropy, in the same manner as the storage layer 23. The reference layer 25 has magnetization in a fixed or invariable direction, and has, for example, coercivity larger than that of the storage layer 23. A "fixed" or "invariable" magnetization direction of the reference layer 25 means that the magnetization direction of the reference layer 25 is not reversed by a write current having an amount that is capable of reversing the magnetization of the storage layer 23.

A combination of the storage layer 23, the intermediate layer 24, and the reference layer 25 produces a magnetoresistive effect. Specifically, if the magnetization direction of the storage layer 23 and the magnetization direction of the reference layer 25 are parallel and antiparallel, the magnetoresistive element 22 will have minimum and maximum resistance values, respectively. A high resistance or a low resistance of the magnetoresistive element 22, i.e., a magnetization direction of the storage layer 23, can be used for data storage by, for example, a cell of a storage device.

In the present embodiment, a spin transfer torque write method, in which a write current is supplied to such magnetoresistive element 22, and a magnetization direction of the storage layer 23 is controlled by the write current, is adopted. The magnetoresistive element 22 can take one of a low-resistance state and a high-resistance state, depending on whether the relationship between the magnetization directions of the storage layer 23 and the reference layer 25 is parallel or antiparallel.

If a write current flowing in the direction indicated by arrow A1 in FIG. 3, that is to say flowing from the reference layer 25 to the storage layer 23, is supplied to the magnetoresistive element 22, the relationship between the magnetization directions of the storage layer 23 and the reference layer 25 becomes antiparallel. In this antiparallel state, the resistance value of the magnetoresistive element 22 becomes high, and the magnetoresistive element 22 is set to a high-resistance state. This high-resistance state is called an "AP (Anti-Parallel) state", and is defined, for example, as a state of data "1".

If a write current flowing in the direction indicated by arrow A2 in FIG. 3, i.e., from the storage layer 23 to the reference layer 25, is supplied to the magnetoresistive element 22, the relationship between the magnetization directions of the storage layer 23 and the reference layer 25 becomes parallel. In this parallel state, the resistance value of the magnetoresistive element 22 becomes low, and the magnetoresistive element 22 is set to a low-resistance state. This low-resistance state is called a "P (Parallel) state", and is defined, for example, as a state of data "0".

The following explanations will be given pursuant to the above-described data-defining method; however, the way in which data "1" and data "0" are defined is not limited to the above-described example. For example, the P state may be defined as data "1", and the AP state may be defined as data "0".

[1-3] Operation of Semiconductor Memory Device

Figure 4:
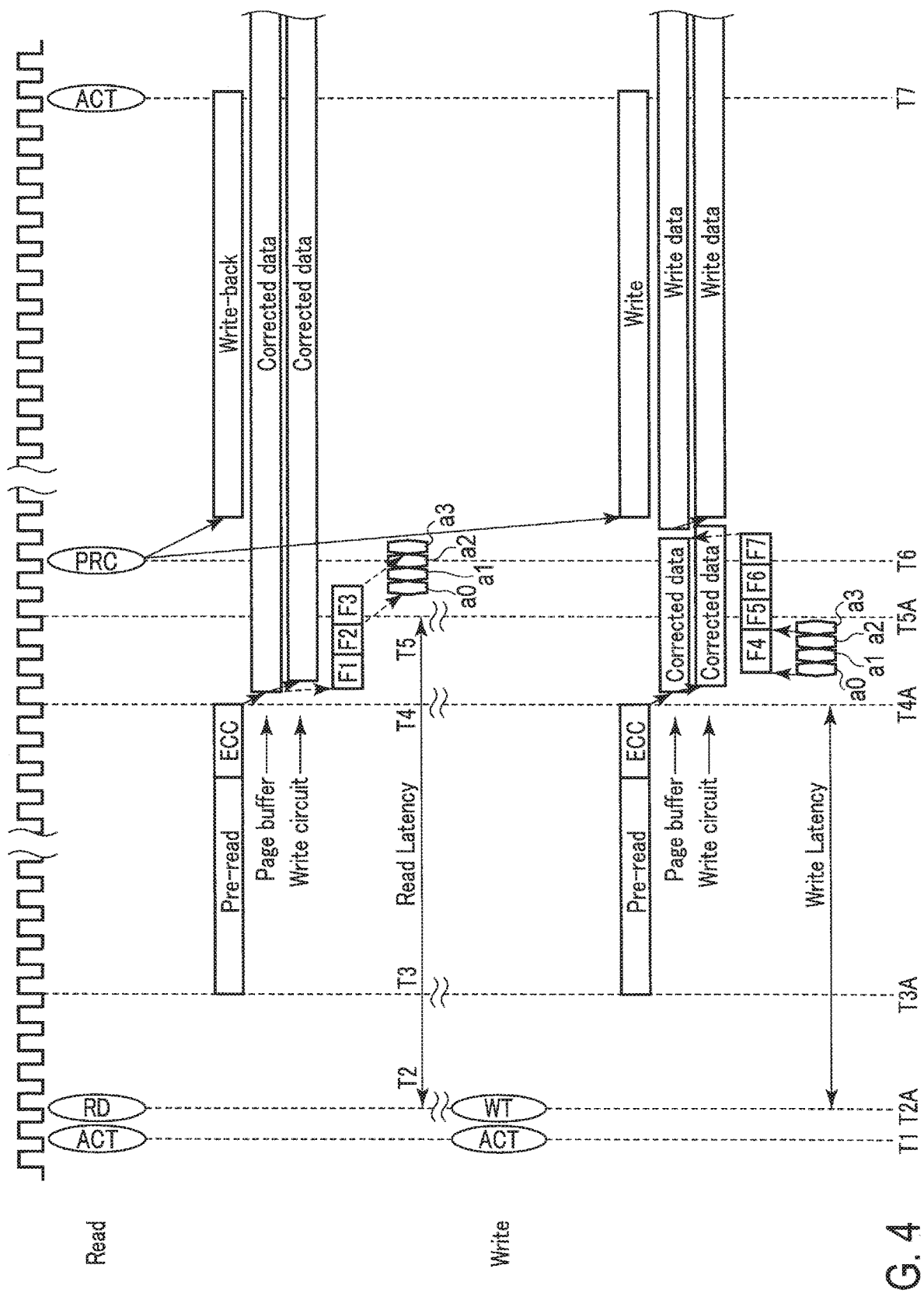
FIG. 4 is a diagram showing an operation example of the semiconductor memory device of the embodiment.
Figure 5:
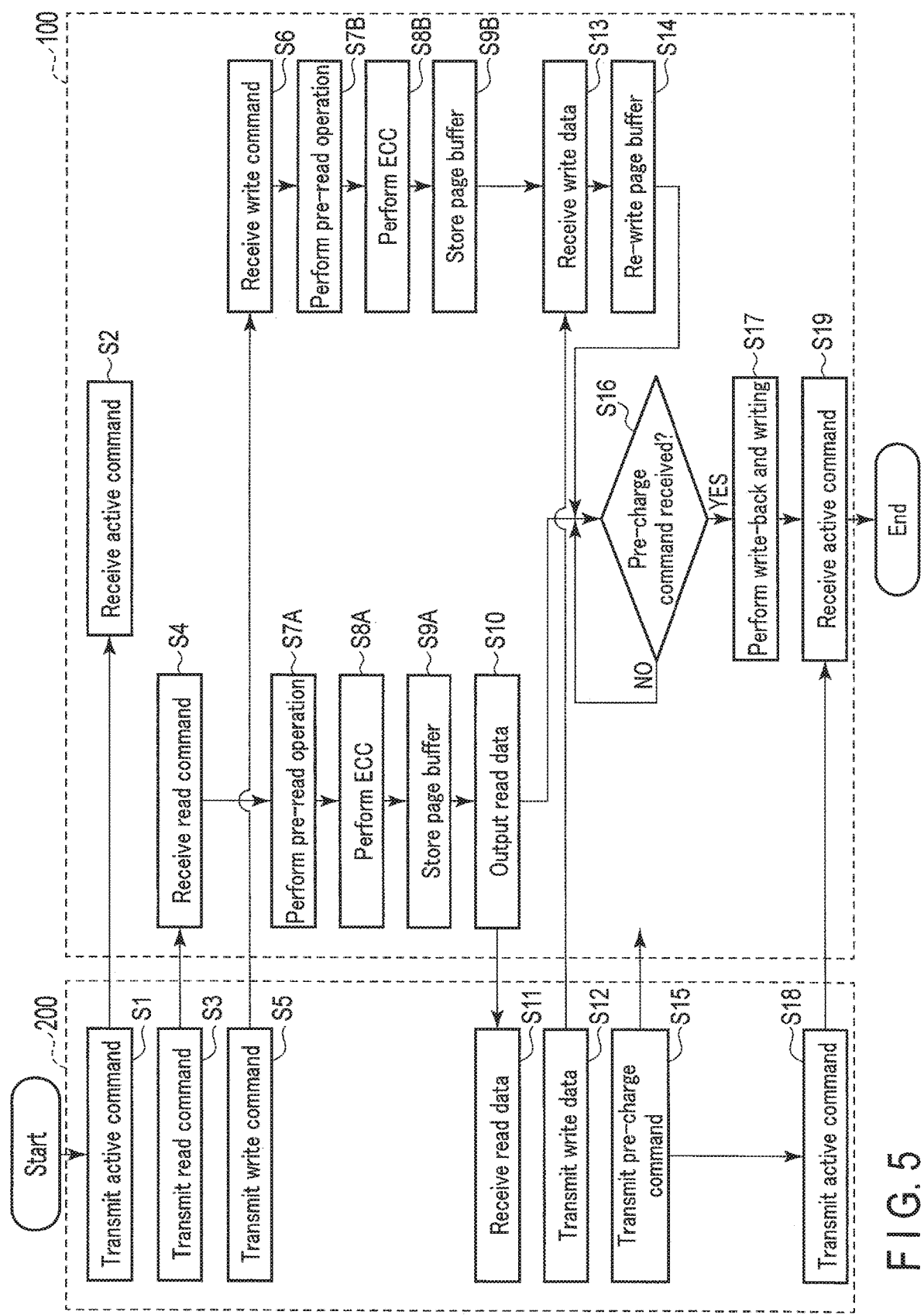
FIG. 5 is a diagram showing an operational flow of the semiconductor memory device of the embodiment.

An operation of the semiconductor memory device 100 of the present embodiment will be explained. FIG. 4 shows an operation example of the semiconductor memory device. FIG. 5 shows an operational flow of the semiconductor memory device. In the semiconductor memory device (hereinafter, memory device) 100, by receiving an active command ACT, a bank in the memory cell array 10 is selected, and a word line WL in the selected bank is further selected. Furthermore, by receiving a read command RD or a write command WT, a column (one or more bit lines) of the read or write target is designated, and each of the read or write operation is performed.

By receiving the active command ACT and the read command RD or the write command WT, an operation to read data from a plurality of memory cells (page) coupled to the selected word line is performed. Hereinafter, the operation of reading data from a page of the selected word line will be call "pre-read".

The ECC circuit then performs error detection and correction on the read data read from the page by the pre-read. Subsequently, the read data in which an error has been corrected (corrected data) is written back to the memory cell of the same column address for each column. Hereinafter, an operation of writing back the corrected data in the bank BNK will be called a "write-back". Data of a column in which no error is detected will not be written back to the memory cell. However, the data of a column in which no error is detected may also be written back to the memory cell.

Here, an operation in the case of receiving one read command RD and one write command WT after receiving an active command ACT will be explained with reference to FIG. 4 and FIG. 5.

First of all, at time T1, the memory controller 200 transmits an active command ACT (including a bank address and a row address) to the command and address input circuit 11 in the memory device 100 (step S1). When the active command ACT is received (step S2), the command and address input circuit 11 transmits the active command ACT to the controller 20 and the row decoder 12. This allows a bank and a word line WL designated by the bank address and the row address that are included in the active command ACT to be selected from the memory cell array 10.

In the case where a read command RD is received, the memory device 100 operates in the following manner.

At time T2, the memory controller 200 transmits a read command RD (including a column address) to the command and address input circuit 11 (step S3). When the read command RD is received (step S4), the command and address input circuit 11 transmits the read command RD to the controller 20 and the column decoder 13. The column decoder 13 decodes the column address included in the read command RD. The column selection circuit 14 selects a column based on the decoding result of the column address. Furthermore, in accordance with the read command RD, the controller 20 controls the read operation for the selected column address.

Subsequently, at time T3, the sense amplifier 15 performs pre-reading for reading data from a memory cell in the page of the selected word line WL (step S7A). The data read by the sense amplifier 15 (hereinafter, read data) is stored in a latch circuit (not shown) in the sense amplifier 15, and is further transferred to the ECC circuit 17.

The ECC circuit 17 performs error detection and correction on the read data. In other words, the ECC circuit 17 detects whether or not there is an error in the read data; and, in the case where there is an error, corrects the error (step S8A).

Subsequently, at time T4, the ECC circuit 17 transfers the read data in which the error has been corrected (corrected data) to the page buffer 18 (step S9A).

The corrected data transferred to the page buffer 18 is transferred to the input/output circuit 19 (F1). The corrected data is converted from parallel data into serial data at the input/output circuit 19 (F2). Furthermore, data a0, a1, a2, and a3 converted into serial data is output from the input/output circuit 19 to the memory controller 20 (F3, steps S10, S11).

The corrected data is further transferred from the page buffer 18 to the write circuit 16. Subsequently, the controller 20 determines whether or not a pre-charge command PRC is received (step S16). In the case where the pre-charge command PRC is not received (NO), the write circuit 16 is put on standby without writing back the corrected data to the memory cell of the read column (column address).

In the case where a write command WT is received, the memory device 100 operates in the following manner. Here, a case in which there is an error in the read data, and the column address to which the corrected data is to be written back matches the column address to be written in accordance with the write command WT is described.

At time T2A, the memory controller 200 transmits a write command WT (including a column address) to the command and address input circuit 11 (step S5). When the write command WT is received (step S6), the command and address input circuit 11 transmits the write command WT to the controller 20 and the column decoder 13. The column decoder 13 decodes the column address included in the write command WT. The column selection circuit 14 selects a column based on the decoding result of the column address. Furthermore, in accordance with the write command WT, the controller 20 controls the write operation for the selected column address.

Subsequently, at time T3A, the sense amplifier 15 performs pre-reading for reading data from a memory cell in the page of the selected word line WL (step S7B). The read data read by the sense amplifier 15 is stored in a latch circuit in the sense amplifier 15, and is further transferred to the ECC circuit 17.

The ECC circuit 17 performs error detection and correction on the read data. In other words, the ECC circuit 17 detects whether or not there is an error in the read data; and, in the case where there is an error, corrects the error (step S8B).

Subsequently, at time T4A, the ECC circuit 17 transfers the read data in which error has been corrected (corrected data) to the page buffer 18. The page buffer 18 temporarily stores the corrected data (step S9B), and further transfers the corrected data to the write circuit 16.

After elapse of write-latency from receiving the write command WT, the memory controller 200 transmits write data a0, a1, a2, and a3 to the input/output circuit 19 (step S12). The write data is received by the input/output circuit 19 (F4, step S13). The write data received by the input/output circuit 19 is converted from serial data into parallel data (F5) and is further transferred to the ECC circuit 17 (F6).

The ECC circuit 17 re-generates a parity bit using the write data (F7). The ECC circuit 17 transfers data obtained by adding the parity bit to the write data to the page buffer 18. Here, at the page buffer 18, data of a column that matches the write target column among the corrected data stored in the page buffer 18 is rewritten into the write data and the data of the parity bit. Subsequently, the data stored in the page buffer 18 is transferred to the write circuit 16.

Then, at time T6, the memory controller 200 transmits a pre-charge command PRC to the command and address input circuit 11 (step S15). When the pre-charge command PRC is received, the command and address input circuit 11 transmits the pre-charge command PRC to the controller 20.

The controller 20 determines whether or not the pre-charge command PRC is received (step S16). In the case where the pre-charge command PRC is not received. (NO), the write circuit 16 is put on standby until the pre-charge command PRC is received.

In the case where the pre-charge command PRC is received (YES), in response to receiving the pre-charge command PRC, the controller 20 causes the write circuit 16 to perform writing to the write target column, and writing back of the corrected data to the column in parallel (step S17). The controller 20 then performs a pre-charge operation in accordance with the pre-charge command PRC.

Subsequently, at time T7, the memory controller 200 transmits an active command ACT to the command and address input circuit 11 (step S18). By receiving this active command ACT (step S19), the controller 20 ends the read and write operations for the designated bank, and also starts read and write operations for other banks or the same bank.

FIG. 6 shows a timing chart of a signal for the writing and writing back in the operation example shown in FIG. 4. Since the reading and writing shown in FIG. 6 are the same as those in FIG. 4, the explanation will be omitted.

Signal PRCHG, signal WAYTS<n>, signal WAYTE<n>, signal WEN<n>, and signal COMP<n> shown in FIG. 6 are generated at the write circuit 16 by receiving the pre-charge command PRC. N is the number of the selected column.

Signal PRCHG is a pulse signal that is generated in response to receiving the pre-charge command PRC, and is a signal that starts both the write and write-back operations. Signal WAYTS<n> is a pulse signal in response to signal PRCHG, and is a start signal for producing a write enable period upon writing and writing back. Signal WAYTE<n> is a pulse signal that is generated by an inner delay circuit using signal WAYTS<n>, and is a signal that determines the end of the write enable period. Signal WEN<n> is a signal of the write enable period that permits performing the writing and writing back.

Signal COMP<n> is a signal for performing (ON) or stopping (OFF) processing of comparing the data stored in the latch circuit of the sense amplifier 15 and the data to be written at the write circuit 16 upon writing and writing back. When signal COMP<n> is asserted, for example, when signal COMP<n> is "H", the write circuit 16 does not operate in the case where the data of the latch circuit of the sense amplifier 15 and the data of the write circuit 16 match. On the other hand, in the case where the data of the latch circuit of the sense amplifier 15 and the data of the write circuit 16 do not match, the write circuit 16 operates and performs writing.

As shown in FIG. 6, when the pre-charge command PRC is received, signal PRCHG is generated. Signal WAYTS<n> is generated by this signal PRCHG, and signal WAYTE<n> is further generated by signal WAYTS<n>.

When signal WAYTS<n> rises to "H", signal WEN<n> goes "H", and when signal WAYTE<n> rises to "H", signal WEN<n> goes "L". In this manner, the period of "H" in signal WEN<n>, that is, the write enable period, is determined.

Writing and writing back are both performed in the write enable period in the signal WEN<n>. In this write enable period, signal COMP<n> is asserted and maintained. Therefore, the processing of comparing the data of the latch circuit of the sense amplifier 15 and the data of the write circuit 16, to determine whether or not to write the data of the write circuit 16 in the memory cell, remains in an execution state.

[1-4] Advantageous Effects of Present Embodiment

According to the present embodiment, a semiconductor memory device that is capable of improving reliability of the memory cell can be provided.

In the present embodiment, in response to receiving the pre-charge command, writing and write-back for writing back the corrected data by the write command are started in parallel. This prevents the write-back from being interrupted by the writing performed by the write command while the write-back is performed on a column that matches the writing and write-back addresses.

When the write-back is interrupted, the processing to compare the data of the latch circuit of the sense amplifier and the data (write data or corrected data) of the write circuit becomes a stopped state in order to prevent the occurrence of a mismatch between the data stored in the latch circuit of the sense amplifier and the data of the memory cell.

In the present embodiment, after the write data is stored in the page buffer, the pre-charge command is received, and the writing and write-back are started. Therefore, since the write-back is not interrupted, upon performing writing and write-back, the processing of comparing the data of the latch circuit of the sense amplifier 15 and the data of the write circuit 16 can be performed. This allows switching between whether or not to perform writing to the memory cell in accordance with the comparison result upon the writing and write-back. In, other words, in the case where the data of the latch circuit of the sense amplifier 15 and the data of the write circuit 16 match, the write circuit 16 does not write the data. The data is written only in the case where the data do not match.

As a result, when performing writing and write-back, unnecessary writing can be reduced, and degradation in the reliability of the memory cell caused by the increased number of writings can be suppressed. That is, the reliability of the memory cells can be improved. Furthermore, since unnecessary writing can be reduced, the power consumption upon writing and write-back can be reduced.

Times of a Row Pre-charge time (tRP) and a Row Cycle time (tRC) in the operational flow of the present embodiment and a comparative example are shown in FIG. 7. In the present embodiment, by receiving the pre-charge command PRC, the writing and write-back are started. Therefore, the time tRP is determined by the time of performing writing and write-back, and becomes longer than that of the comparative example. However, there is no change in the time tRC, and is the same as that of the comparative example. Therefore, the write operation and the read operation of the present embodiment would not be influenced thereby.

The time tRP is a time from which the memory device 100 receives a pre-charge command PRC until it receives an active command ACT. The time tRC is a time in which a read operation or/and a write operation is performed with respect to the same bank.

In the comparative example, write-back and writing are started respectively by a signal generated in accordance with the reception of an active command ACT and a write command WT. In other words, in the comparative example, to start the write-back and the writing, two write control signals are necessary.

In contrast, in the present embodiment, writing and write-back are started by a signal PCHG that is generated in accordance with the reception of the pre-charge command. In other words, in the present embodiment, since only one write control signal is necessary for starting the writing and write-back, the write timing can be controlled simply.

[2] Other Modified Examples, Etc.

In the present embodiment, an MRAM using a magnetoresistive element is given as an example of the semiconductor memory device; however, the semiconductor memory device is not limited thereto, and can be applied to various types of nonvolatile memory. The semiconductor memory device can also be applied to a resistance change memory that is the same type as the MRAM, such as a Resistive Random Access Memory (ReRAM) and a Phase-Change Random Access Memory (PCRAM).

Furthermore, in the present embodiment, a case in which a perpendicular magnetization type magnetoresistive element is used for the memory cell is explained; however, the embodiment is not necessarily limited thereto. For example, the embodiment is applicable in the same manner also in the case of using an in-plane magnetization magnetoresistive element.

In addition, the embodiment is applicable to a memory cell including a resistive memory element, such as a magnetoresistive element (MTJ element) for storing data by resistance change due to current or voltage application, or to a semiconductor memory device including such a memory cell.

The embodiment is further applicable to a memory cell including a memory element which is capable of reading stored data by converting a resistance difference due to a resistance change into a current difference or a voltage difference, or to a semiconductor memory device including such a memory cell.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the invention. The accompanying claims and their equivalents are intended to cover such forms or modifications as would fall within the scope and spirit of the invention.

What is claimed is:

1. A semiconductor memory device comprising:
   first and second memory cells;
   a read circuit configured to read first data from the first memory cell by receiving a first command;
   a correcting circuit configured to generate second data by correcting an error included in the first data;
   a storage circuit configured to store third data and the second data by receiving a second command; and
   a write circuit configured to, in response to receiving a third command, perform a first writing for writing the second data to the first memory cell, and to perform a second writing for writing the third data to the second memory cell,
   wherein the first writing and the second writing are started in parallel in response to receiving the third command.

2. The semiconductor memory device according to claim 1, wherein the first writing and the second writing are started by a same signal that is generated in response to receiving the third command.

3. The semiconductor memory device according to claim 1, wherein:
   in the second writing, fourth data held in the read circuit and the third data are compared,
   in a case where the fourth data and the third data match, the write circuit does not write the third data to the second memory cell, and
   in a case where the fourth data and the third data do not match, the write circuit writes the third data to the second memory cell.

4. The semiconductor memory device according to claim 1, further comprising bit lines, source lines, and a word line that are electrically coupled to the first and second memory cells,
   wherein:
   a fourth command is received prior to receiving the first command, and
   the word line is selected based on the fourth command.

5. The semiconductor memory device according to claim 4, wherein:
   the first command includes a read command selecting the bit lines and the source lines,
   the second command includes a write command selecting the bit lines and the source lines, and
   the third command includes a pre-charge command setting the bit lines, the source lines, and the word line to a non-selected state.

6. The semiconductor memory device according to claim 1, wherein:
   the correcting circuit detects and corrects an error with respect to the first data, and
   in a case where an error is not detected in the first data, in response to receiving the third command, the write circuit does not write the first data to the first memory cell.

7. The semiconductor memory device according to claim 1, wherein:
   the correcting circuit detects and corrects an error with respect to the first data, and
   in a case where an error is not detected in the first data, in response to receiving the third command, the write circuit writes the first data to the first memory cell.

8. The semiconductor memory device according to claim 1, wherein the first and second memory cells are resistance change elements capable of storing data.

* * * * *